US012669548B2

(12) United States Patent
Lesso

(10) Patent No.: US 12,669,548 B2
(45) Date of Patent: Jun. 30, 2026

(54) ELECTROCHEMICAL CELL CHARACTERISATION

(71) Applicant: Cirrus Logic International Semiconductor Ltd., Edinburgh (GB)

(72) Inventor: John P. Lesso, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 391 days.

(21) Appl. No.: 18/332,382

(22) Filed: Jun. 9, 2023

(65) Prior Publication Data

US 2023/0408597 A1 Dec. 21, 2023

Related U.S. Application Data

(60) Provisional application No. 63/353,924, filed on Jun. 21, 2022.

(51) Int. Cl.
| | |
|---|---|
| *G01R 31/389* | (2019.01) |
| *G01R 31/36* | (2020.01) |
| *G01R 31/367* | (2019.01) |
| *G01R 31/374* | (2019.01) |

(52) U.S. Cl.
CPC ....... *G01R 31/389* (2019.01); *G01R 31/3648* (2013.01); *G01R 31/367* (2019.01); *G01R 31/374* (2019.01)

(58) Field of Classification Search
CPC . G01R 31/389; G01R 31/3648; G01R 31/367
See application file for complete search history.

(56) References Cited

U.S. PATENT DOCUMENTS

| | | | | |
|---|---|---|---|---|
| 2003/0206021 | A1* | 11/2003 | Laletin | G01R 31/386 |
| | | | | 324/426 |
| 2024/0302443 | A1* | 9/2024 | Yellepeddi | G01R 1/203 |
| 2025/0213859 | A1* | 7/2025 | Windmiller | A61B 5/6833 |

FOREIGN PATENT DOCUMENTS

| | | |
|---|---|---|
| WO | 8902593 A1 | 3/1989 |
| WO | 2020251934 A1 | 12/2020 |

OTHER PUBLICATIONS

Combined Search and Examination Report under Sections 17 and 18(3), UKIPO, Application No. GB2308617.6, mailed Nov. 22, 2023.

* cited by examiner

*Primary Examiner* — Ricky Go
(74) *Attorney, Agent, or Firm* — Jackson Walker L.L.P.

(57) ABSTRACT

Circuitry for a resistance of an electrochemical cell comprising at least one first electrode and a second electrode, the circuitry comprising: drive circuitry configured to apply a stimulus to the at least one first electrode of the electrochemical cell; sense circuitry configured to measure a response of the electrochemical cell to the stimulus, the response comprising a faradaic component and a non-faradaic component; and processing circuitry configured to: sample the response at a sample time, the sample time selected to maximise a ratio of the non-faradaic component to the faradaic component; and determine the resistance of the electrochemical cell based on the response at the sample time.

22 Claims, 8 Drawing Sheets

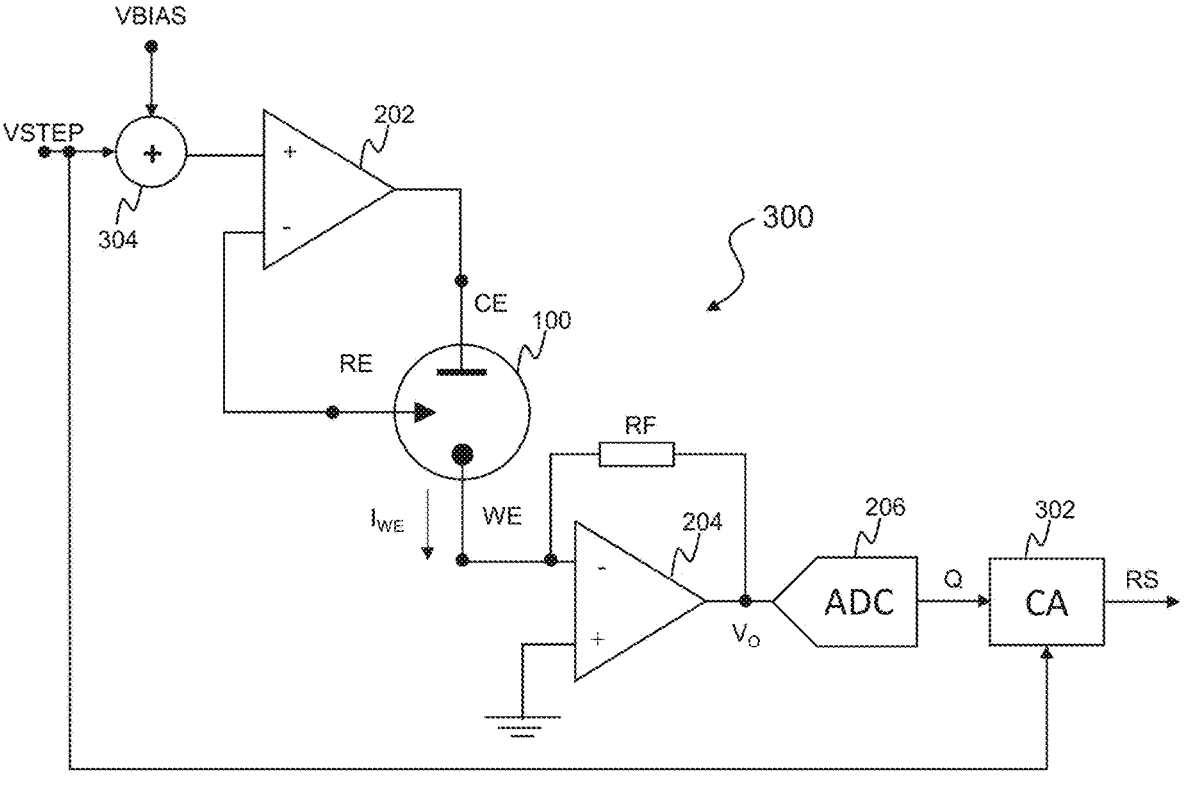
Fig. 3
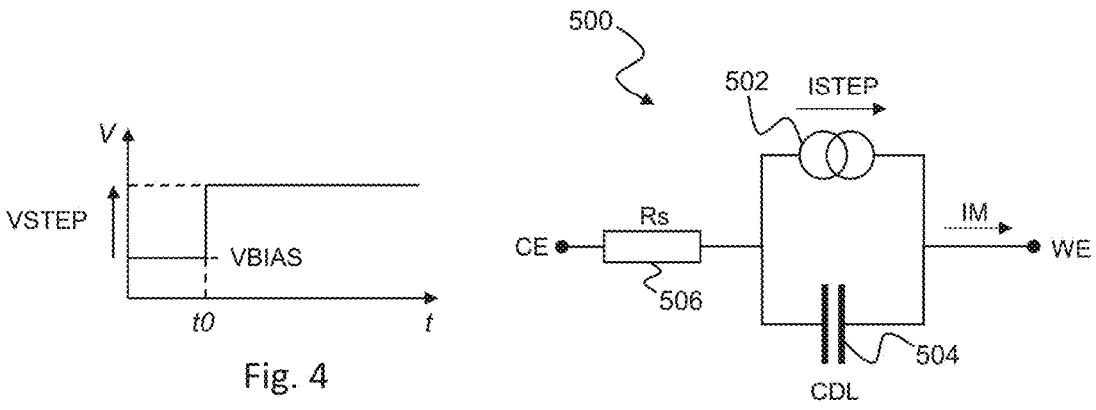
Fig. 4
Fig. 5

ELECTROCHEMICAL CELL CHARACTERISATION

The present disclosure claims priority to U.S. Provisional Patent Application Ser. No. 63/353,924, filed Jun. 21, 2022, which is incorporated by reference herein in its entirety.

TECHNICAL FIELD

The present disclosure relates to circuitry for measuring characteristics in electrochemical sensors.

BACKGROUND

Chronoamperometry is a known technique for characterising electrochemical systems, such as electrochemical cells. A stepped (or impulse) stimulus is applied to an electrochemical cell (or other device under test) and an electrical response of the cell to the step is measured as a function of time. With knowledge of the stepped stimulus and the measured response, impedance characteristics of the cell can be ascertained.

A traditional approach to chronoamperometry involves using a digital-to-analog converter (DAC) to drive a stimulus into an electrochemical system and using an analog-to-digital converter (ADC) to measure a response to that stimulus. For an electrochemical sensor, the stimulus is typically a voltage, and the measured response is a current. For a potentiometric electrochemical cell or an electrochemical cell acting as a power source (i.e. a battery), the driving stimulus is typically a current, and the measured response is a voltage.

SUMMARY

According to a first aspect of the disclosure, there is provided circuitry for determining an impedance of an electrochemical cell comprising at least one first electrode and a second electrode, the circuitry comprising Circuitry for determining a resistance of an electrochemical cell comprising at least one first electrode and a second electrode, the circuitry comprising: drive circuitry configured to apply a stimulus to the at least one first electrode of the electrochemical cell; sense circuitry configured to measure a response of the electrochemical cell to the stimulus, the response comprising a faradaic component and a non-faradaic component; and processing circuitry configured to: sample the response at a sample time, the sample time selected to maximise a ratio of the non-faradaic component to the faradaic component; and determine the resistance of the electrochemical cell based on the response at the sample time.

The stimulus may comprise a step signal or an impulse signal.

The resistance may be a series resistance of the electrochemical cell or coupled to the electrochemical cell.

The sample time may coincide with a time at which a rate of change of the ratio is within a threshold range of zero.

The sample time ($t_{opt}$) may be determined as follows:

$$t_{opt} = \frac{C_{OPT} R_{OPT}}{2}$$

where $C_{OPT}$ is an estimated capacitance value of a double-layer capacitance $C_{DL}$ of the electrochemical cell and $R_{OPT}$ is an estimated resistance value of the resistance.

The estimated resistance value $R_{OPT}$ may be determined as an arithmetic mean of a maximum value and a minimum value of the resistance. The estimated capacitance value $C_{OPT}$ may be determined as an arithmetic mean of a maximum value and a minimum value of double-layer capacitance $C_{DL}$.

The estimated resistance value $R_{OPT}$ may be determined as a geometric mean of a maximum value and a minimum value of the resistance, and wherein the estimated capacitance value $C_{OPT}$ is determined as a geometric mean of a maximum value and a minimum value of double-layer capacitance $C_{DL}$.

The sample time may be selected based on a statistical distribution of the resistance of the electrochemical cell and a double-layer capacitance of the electrochemical cell. Selecting the sample time based on the statistical distribution may comprise measuring a central tendency of the statistical distribution.

The sample time may be determined by numerical optimization of the equation.

In some embodiments, the sample time may be selected using a trained neural network.

The processing circuitry may be configured to: detect when an amplitude of the measured response drops below an amplitude threshold. The sample time may coincide with a time at which the amplitude of the measured response drops below an amplitude threshold. The amplitude threshold may be calculated based on a maximum amplitude of the measured response.

The circuitry may be configured to repeat, over one or more repetitions, the steps of applying the stimulus, measuring the response, and sampling the response at the sample time. The processing circuitry may be configured to: adjust the sampling time in one or more of the one or more repetitions.

The processing circuitry may be configured to adjust the sampling time based on a change in condition at the electrochemical cell.

The change in condition may comprise one or more of ageing of the electrochemical cell; a change in temperature at the electrochemical cell; and a change in pressure at the electrochemical cell.

The processing circuitry may be configured to determine, based on the determined resistance, one or more of the following: a) an optimum bias voltage to be applied to the electrochemical cell during sensing of an analyte; b) a quality of an electrolyte in the electrochemical cell; c) a fault at the electrochemical cell; d) determine one or more offsets for subsequent processing; e) updating an equivalent circuit model (ECM) for the electrochemical cell.

The electrochemical cell may be an electrochemical sensor. The stimulus may be a stimulus voltage, and the measured response may be a response current.

The resistance $R_S$ may be calculated using the following equation:

$$R_s = \frac{V_{STEP}}{I_M \sqrt{e}}$$

Where $V_{STIM}$ is the stimulus voltage and $I_M$ is the response current.

The circuitry may further comprise a memory. The memory may be configured to store predetermined resistance values for the resistance at a plurality of values of the measured response.

The memory may be configured to store predetermined resistance values for the resistance of the cell in response to stimuli having different amplitudes. The processing circuitry may be configured to control the drive circuitry to apply the stimulus at one of the different amplitudes; and to determine the resistance based on a predetermined resistance value stored in the memory which corresponds with the one of the different amplitudes. The memory may be configured to store predetermined resistance values for the resistance of the cell at a plurality of different temperatures. The processing circuitry may be configured to determine the resistance based on a measured temperature of the electrochemical cell and the predetermined resistance value stored in the memory which corresponds with the measured temperature.

The memory may be configured to store predetermined resistance values for the resistance of the cell at a plurality of different values of double layer capacitance of the cell. The processing circuitry may be configured to determine the resistance based on a measured double layer capacitance of the electrochemical cell and the predetermined resistance value stored in the memory which corresponds with the measured temperature.

The processing circuitry may comprise an analog-to-digital converter (ADC) configured to sample the response. The processing circuitry may be configured to enable the ADC at the sample time.

The drive circuitry may comprise a digital-to-analog converter configured to generate the stimulus responsive to a digital input signal.

The electrochemical cell may comprise an amperometric sensor. The amperometric sensor may comprises a potentiostat.

Additionally or alternatively, the electrochemical cell may comprise a potentiometric sensor or a battery.

According to another aspect of the disclosure, there is provided a system comprising: the circuitry described above, and the electrochemical cell described above.

According to another aspect of the disclosure, there is provided an electronic device comprising the circuitry or the system described above.

The device may comprise an analyte monitoring device or an analyte sensing device, such as a continuous glucose monitor.

The device may comprise a battery or potentiometric sensor (such as a pH meter).

The device may comprise one of a mobile computing device, a laptop computer, a tablet computer, a games console, a remote control device, a home automation controller or a domestic appliance, a toy, a robot, an audio player, a video player, or a mobile telephone, and a smartphone.

According to another aspect of the disclosure, there is provided a method of determining an resistance of an electrochemical cell comprising at least one first electrode and a second electrode, the method comprising: apply a stimulus to the at least one first electrode of the electrochemical cell; measure a response of the electrochemical cell to the stimulus, the response comprising a faradaic component and a non-faradaic component; sample the response at a sample time, the sample time selected to maximise a ratio of the non-faradaic component to the faradaic component; and determine the resistance of the electrochemical cell based on the response at the sample time.

Throughout this specification the word "comprise", or variations such as "comprises" or "comprising", will be understood to imply the inclusion of a stated element, integer or step, or group of elements, integers, or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which:

FIG. 3 is a schematic diagram of a drive and measurement circuit for characterising an electrochemical cell;

FIG. 4 is a graph showing an example stepped stimulus applied using the circuit of FIG. 4;

FIG. 5 is a graph of an example circuit model for an electrochemical cell;

DESCRIPTION OF EMBODIMENTS

Electrochemical sensors are widely used for the detection of one or more particular chemical species, analytes, as an oxidation or reduction current. Such sensors comprise an electrochemical cell, consisting of two or more electrodes configured for contact with an analyte whose concentration is to be ascertained. Such sensors also comprise circuitry for driving one or more of the electrodes and for measuring a response at one or more of the electrodes. Batteries also comprise one or more electrochemical cells which typically consist of two or more electrodes (e.g., an anode and a cathode) configured for contact with a conductive electrolyte. Characteristics of batteries may be ascertained using drive and measurement circuitry similar to that used for characterising electrochemical cells in electrochemical sensors.

Embodiments of the present disclosure provide various novel drive and measurement regimes for characterising electrochemical cells and systems (such as sensors, batteries, and the like) into which electrochemical cells are incorporated. Specifically, embodiments of the present disclosure relate to novel techniques for improving measurements made using chronoamperometry.

Figure 1:
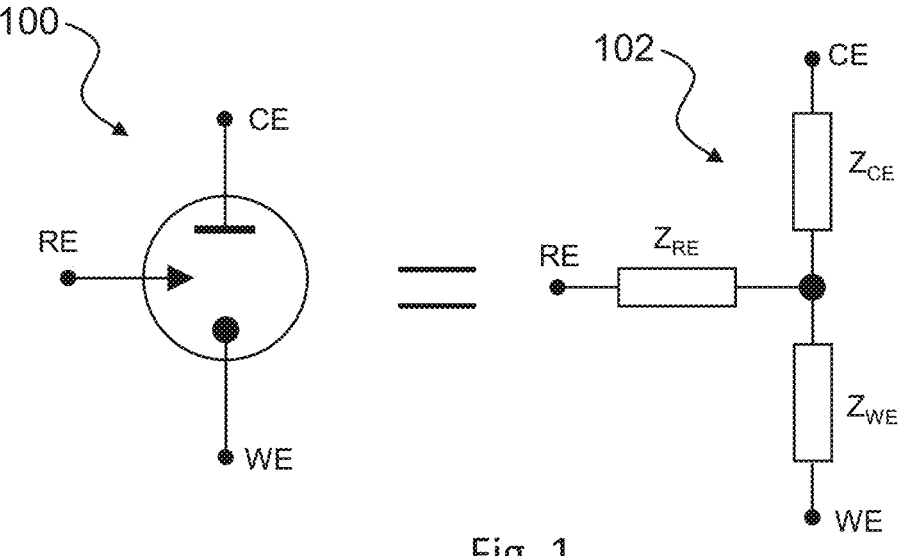
FIG. 1 illustrates a schematic diagram and electrical equivalent circuit for a three-electrode electrochemical cell.

FIG. 1 is a schematic diagram of an example electrochemical cell 100 comprising three electrodes, namely a counter electrode CE, a working electrode WE and a reference electrode RE. FIG. 1 also shows an equivalent circuit 102 for the electrochemical cell comprising a counter electrode impedance ZCE, a working electrode impedance ZWE and a reference electrode impedance ZRE. Embodiments of the disclosure will be described with reference to this example electrochemical cell 100. It will be appreciated, however, that the techniques and apparatus described herein may be used in conjunction with any conceivable electrochemical system, including but not limited to two-electrode electrochemical cells (e.g., cells comprising a counter electrode CE and a working electrode WE and no reference electrode), or electrochemical cells with more than three electrodes. Electrodes of the electrochemical cells described herein may also be referred to as anodes and/or cathodes as is conventional in the field of electrical batteries.

To determine a characteristic of the electrochemical cell 100, and therefore an analyte concentration, a bias voltage is applied at the counter electrode CE and a current at the working electrode WE is measured. The reference electrode RE is used to measure a voltage drop between the working electrode WE and the reference electrode RE. The bias voltage is then adjusted to maintain the voltage drop between RE and WE constant. As the resistance in the cell 100 increases, the current measured at the working electrode WE decreases. Likewise, as the resistance in the cell 100 decreases, the current measured at the working electrode WE increases. Thus the electrochemical cell 100 reaches a state of equilibrium where the voltage drop between the reference electrode RE and the working electrode WE is maintained constant. Since the bias voltage at the counter electrode CE and the measured current at WE are known, the resistance of the cell 100 can be ascertained.

Figure 2:
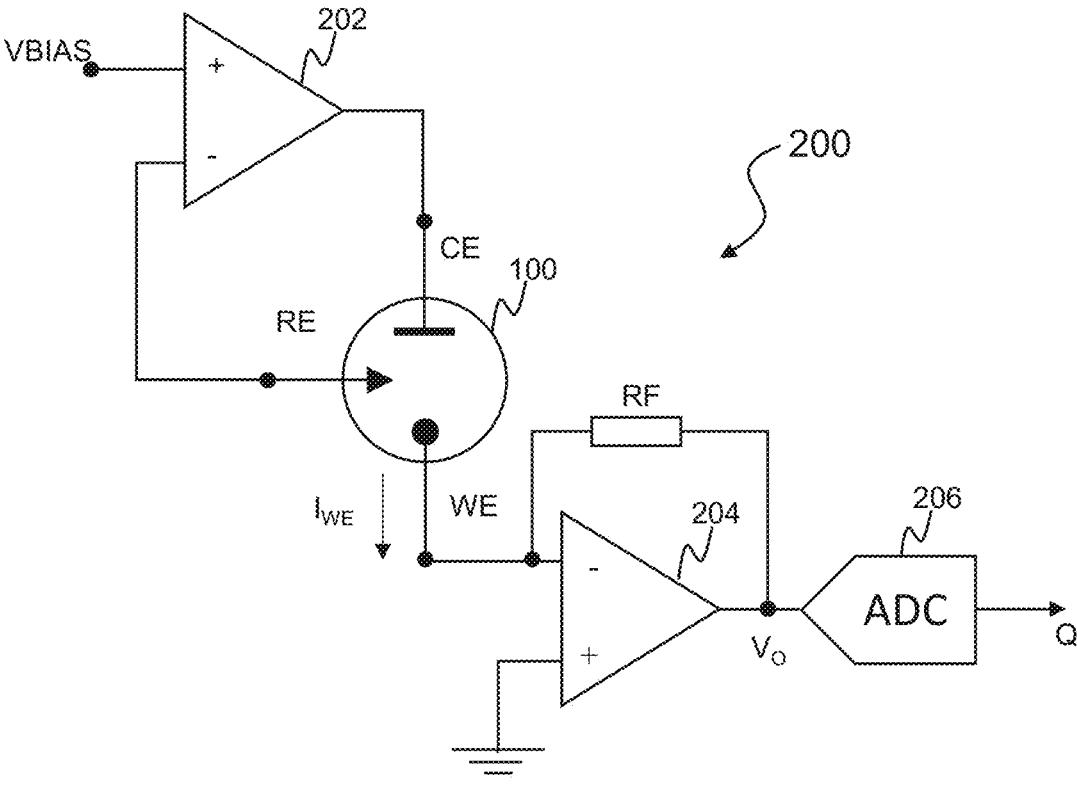
FIG. 2 is a schematic diagram of an example prior art measurement circuit.

FIG. 2 illustrates an example prior art drive and measurement circuit 200 which is configured to implement the above explained cell characterisation, specifically for measuring an analyte concentration in the electrochemical cell 100 shown in FIG. 1. The circuit 200 comprises a first amplifier 202 and a second amplifier 204. Each of the first and second amplifiers 202, 204 may comprise one or more op-amps. A non-inverting input of the first amplifier 202 is coupled to a bias voltage VBIAS which may be generated by a digital-to-analog converter DAC (not shown). An inverting input of the first amplifier 202 is coupled to the reference electrode RE. An output of the first amplifier 202 is coupled to the counter electrode CE and configured to drive the counter electrode CE with a counter electrode bias voltage VCE. The counter electrode bias voltage VCE applied at the counter electrode CE by the first amplifier 202 is proportional to the difference between the bias voltage VBIAS and the voltage VRE at the reference electrode RE. As such, the first amplifier 202 acts to maintain the voltage between the reference electrode RE and the working electrode WE at the bias voltage VBIAS. An inverting input of the second amplifier 204 is coupled to the working electrode WE and a non-inverting input of the second amplifier 204 is coupled to a fixed reference voltage, in this case ground GND. A feedback resistor RF is coupled between the non-inverting input and an output of the second amplifier 204. As such, the second amplifier 204 may operate as a transimpedance amplifier. The second amplifier 204 is thus operable to output a voltage VO which is proportional to the current IWE at the working electrode WE. The output voltage VO is then provided to an analog-to-digital converter (ADC) 206 which outputs a digital output Q which represents the current IWE at the working electrode WE.

To bias the counter electrode CE, and therefore the electrochemical cell 100, at different voltages, the bias voltage VBIAS may be adjusted. The bias voltage VBIAS may be adjusted between a reference voltage (e.g. ground or zero volts) and the supply voltage VDD. With the non-inverting input of the second amplifier 204 is set at VDD/2, a positive bias may be applied to the cell 100 by maintaining the bias voltage VBIAS above VDD/2. Likewise, a negative bias may be applied to the cell 100 by maintaining the bias voltage VBIAS below VDD/2.

The drive and measurement circuitry 200 described above may be used to implement chronoamperometry (CA) on the cell 100.

To implement chronoamperometry, a step or impulse stimulus may be applied to the cell 100 (on top of or in place of the bias voltage VBIAS) and a response of the cell 100 to that stimulus may be measured. One or more electrical and/or chemical characteristics of the cell 100 can then be inferred from the measured response.

In the example shown in FIG. 2, the cell 100 is in the form of an amperometric sensor. As such, the stimulus applied for CA is a voltage stimulus and the measured response is a current. As will be discussed in detail below, in other embodiments, a potentiometric sensor or battery may be characterised using CA by applying a current stimulus and measuring a voltage response of the cell(s) comprised in the sensor or battery.

FIG. 3 illustrates an example drive and measurement circuit 300 according to embodiments of the present disclosure. The circuit 300 of FIG. 3 is a variation of the circuit 200 of FIG. 2, like parts being given like numbering. In addition to all of the components of the circuit 200 of FIG. 2, the circuit 300 of FIG. 3 comprises a CA processor 302 and an adder 304. A step voltage VSTEP is added at the adder 304 to an optional bias voltage VBIAS which is applied to the cell 100 at the counter electrode CE using the first amplifier 202. In other embodiments, the step voltage VSTEP and bias voltage VBIAS may be combined in another manner known in the art. Additionally or alternatively, the bias voltage VBIAS may be zero volts. In which case, the adder 304 may be omitted and the stimulus waveform (which comprises the step voltage VSTEP) may be applied directly to the first amplifier 202.

FIG. 4 is a waveform of an example voltage stimulus which may be applied to the cell 100 using the circuit 300 shown in FIG. 3. The stimulus comprises a bias voltage VBIAS superimposed with a step voltage VSTEP applied at time t0.

The step voltage VSTEP (or an indication thereof) may also be provided as an input to the CA processor 302 which may use this information for chronoamperometry calculations, as described in more detail below.

The CA processor 302 is coupled to an output of the ADC 206 and configured to receive the digital output Q from the ADC 206. The digital output Q represents the current IWE at the working electrode WE, herein also referred to as the measurement current IM. The CA processor 302 may then derive, based on the digital output Q, the step voltage VSTEP and optionally one or more additional conditions, a resistance value RS corresponding to an effective resistance of the cell 100. Example techniques for determining (or inferring/estimating) the resistance RS by the CA processor will now be described.

FIG. 5 illustrates an example model 500 for the cell 100 responsive to a voltage stimulus, such as the stimulus shown in FIG. 4. The model 500 comprises a current source 502, a load capacitor 504 having a double layer capacitance CDL, and a series resistor 506 with resistance RS. The current source 502 is provided in parallel with a load capacitor 504. The series resistor 506 is provided in series with the parallel combination of the current source 502 and the load capacitor 504.

As noted above, the resistance RS represents the effective resistance of the cell 100. The load capacitor 504 represents the double-layer capacitance CDL of the cell 100. The current source 502 generates a current ISTEP which represents the current flowing through the cell 100 arising from a step voltage stimulus VSTEP applied to the cell 100. The total current IT (which can be measured as the measured current IM or working electrode current IWE) represents the total current flowing through the cell 100.

It can be seen that a measurement of the total current IT can be used to determine the value of the resistance RS which represents the effective resistance of the cell 100.

The total current IT comprises a Faradaic component IF and a non-Faradaic component INF. The Faradaic component IF flows due to chemical reactions in the cell 100. This current is governed by the Cottrell equation. The non-Faradaic current INF flows due to electrical characteristics of the cell 100 and associated components (e.g., inductance, double layer capacitance etc.). The total current IT may be defined as the sum of the Faradaic and non-Faradaic currents IF, INF, i.e.:

$$IT = IF + INF$$

As noted above, the Faradaic component IF for a planar electrode may be described using the Cottrell equation as shown below.

$$IF = \frac{nFAC_0\sqrt{D}}{\sqrt{\pi t}}$$

Where n is the number of electrons required to reduce or oxidise one molecule of analyte in the cell 100, F is the Faraday constant, A is the area of the electrode (e.g., working electrode WE), CO is the initial concentration of the reducible analyte, D is the diffusion coefficient for the analyte, and t is time.

The non-Faradaic current INF can be described in terms of the voltage step VSTEP, and the series resistance RS as follows.

$$INF = \frac{VSTEP}{RS}e^{-\frac{t}{\tau}}$$

Where the time constant tau is given by:

$$\tau = RS * CDL$$

Thus, the total current IT is given by the following equation.

$$IT = \frac{VSTEP}{RS}e^{-\frac{t}{\tau}} + \frac{nFAC_0\sqrt{D}}{\sqrt{\pi t}} + \beta$$

Where $\beta$ is a constant term representing a background current (e.g. in an analyte sensor, this term may represent an analyte level). The above equation can be rewritten in simplified form to generalize to all electrode shapes (e.g. all ultra-micro electrodes or UMEs) and ignore the background current term $\beta$ as follows:

$$IT = \frac{VSTEP}{RS}e^{-\frac{t}{\tau}} + \frac{k}{\sqrt{t}}$$

Where k is given by the following equation:

$$k = \frac{FAC_0\sqrt{D}}{\sqrt{\pi}}$$

It can be seen from the above equations that with knowledge of the step voltage VSTEP and measurement of the total current IT (i.e., the measured response of the cell 100 to the voltage stimulus) the effective resistance RS of the cell 100 can be inferred.

It will also be appreciated that to accurately infer the effective resistance RS of the cell 100 (which is responsible for the non-Faradaic current INF component of the total current IT), it is advantageous to minimise the impact of the Faradaic current IF component.

Embodiments of the present disclosure aim to minimise the impact of Faradaic current IF on measurement of non-Faradaic current by sampling the measured response of the cell 100 at a time where the ratio of non-Faradaic current INF to Faradaic current IF in the measured response is at or near to its maximum. An effect of sampling at this optimum sample time is that the sampled current represents the highest possible ratio of non-Faradaic current INF to Faradaic current IF. In other words, an effect is to produce a measurement of INF having a relatively high signal-to-noise ratio (SNR) where the Faradaic current (IF) is considered noise in the measurement.

In some embodiments, the optimum sample time (topt) may be obtained by determining when the rate of change of the ratio of INF to IF approaches or reaches zero. For example, where:

$$\frac{d}{dt}\left\{\frac{INF}{IF}\right\} = 0$$

$$\frac{d}{dt}\left\{\frac{kRSe^{\frac{topt}{\tau}}}{VSTEP\sqrt{topt}}\right\} = 0$$

Solving the above equation for optimum sample time topt, gives:

$$topt = \frac{CDL * RS}{2}$$

At this optimum sampling time topt, RS can be inferred or estimated from the measured current IM at the cell 100 using the following equation:

$$RS = \frac{VSTEP}{IM\sqrt{e}}$$

It will thus be appreciated that, if the step stimulus voltage VSTEP is known, the effective resistance RS of the cell 100 can be deduced from the measured current IM.

Figure 6:
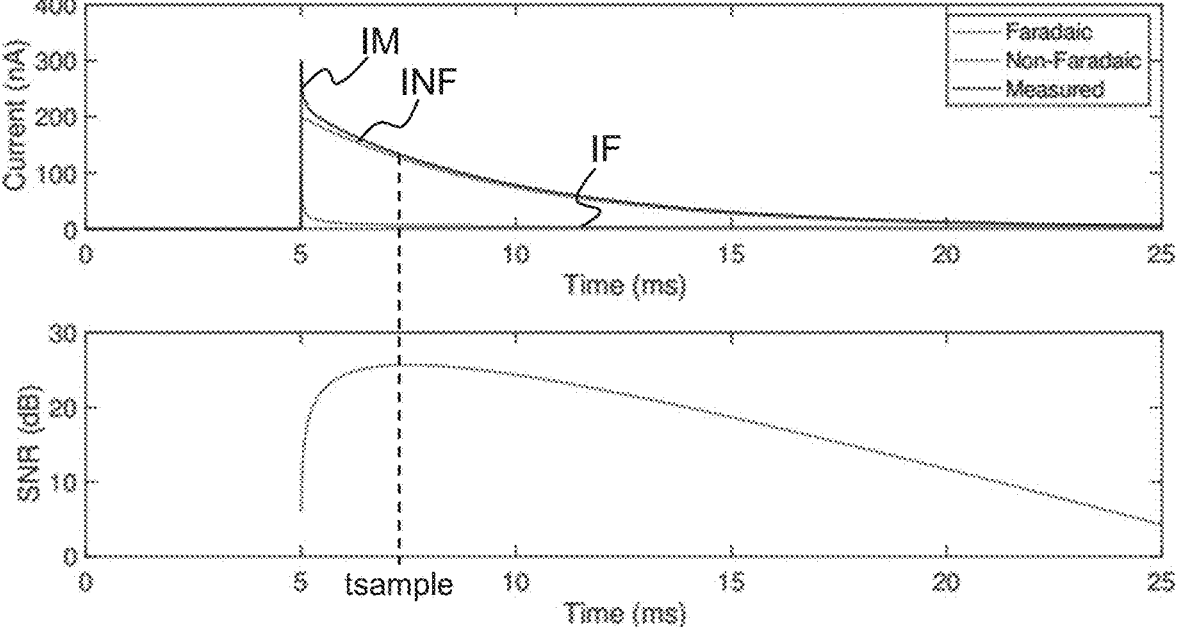
FIGS. 6 to 8 are graphical illustration of Faradaic and non-Faradaic current components and SNR of non-Faradaic current for various simulated measured responses of an electrochemical cell.

It can be seen from the above equation that the approximated effective resistance RS of the cell 100 is independent of Faradaic current IF. This is also shown by FIG. 6 in which measured current IM and simulated Faradaic and non-Faradaic currents IF, INF are plotted with respect to time. SNR of non-Faradaic current INF is also plotted in FIG. 6. At peak SNR of non-Faradaic current INF (i.e. at the maximum ratio of INF:IF), the Faradaic current IF is minimal, and the measured current IM is a good approximation of the Faradaic current IF.

Figure 7:
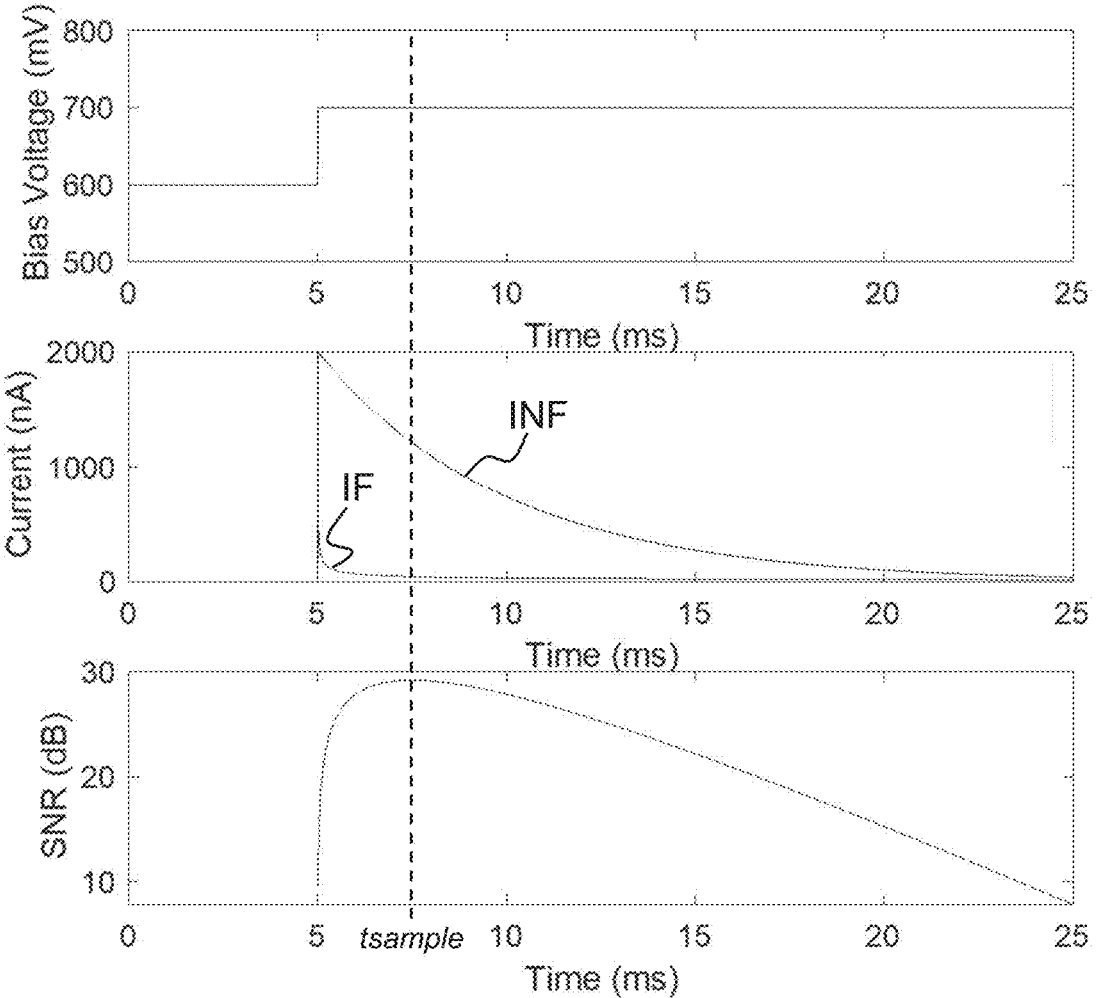
Figure 8:
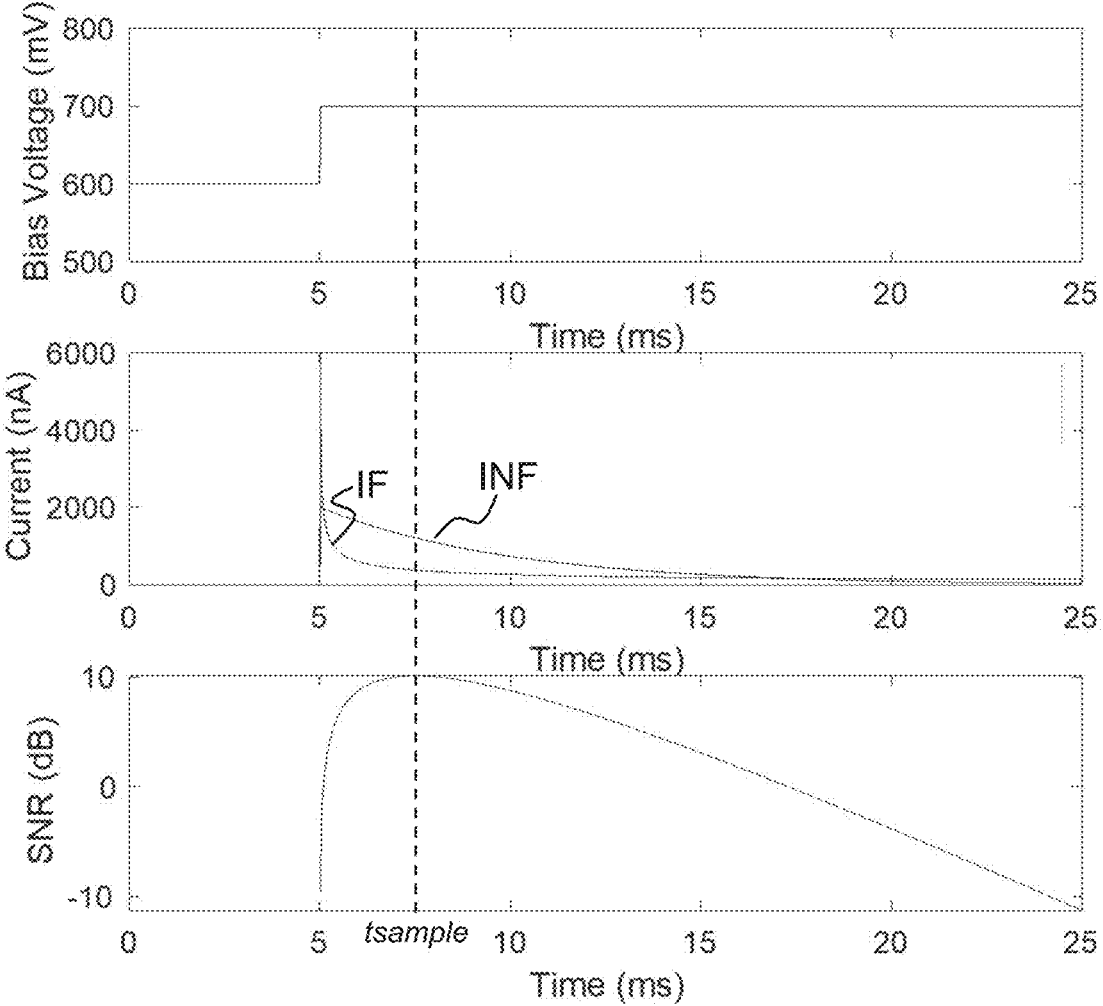

It can also be shown that the optimum sample time topt at which the SNR of non-Faradaic current INF is maximised is independent of Faradaic current IF present. FIGS. 7 and 8 plot simulated Faradaic and non-Faradaic currents IF, INF with respect to time, in addition to SNR. It can be seen, by comparing the two Figures, that in each case the maximum SNR occurs are the same time (approx. 7 ms), despite the Faradaic component IF being substantially different in the two example shown.

As such, and referring again to FIG. 3, the CA processor 302 may be configured to deduce the effective resistance RS of the cell 100 from the measured working electrode current IWE by controlling the ADC 206 to sample the output voltage VO at the output of the second amplifier 204 to coincide with the optimum sample time topt. Having knowledge of the above equation for RS, a determination of the effective resistance RS may be performed.

As noted above, to maximise the SNR of the non-Faradaic component INF of the measured current IM (e.g. IWE), the sample time topt which corresponds to this peak SNR may be calculated. In some embodiments, this calculation may be performed during calibration of the circuit 300, and the optimal sample time topt fixed during further operation. Alternatively, the determination of optimum sample time topt may be performed periodically. In some embodiment, the determination is performed dynamically as will be described in more detail below.

The optimum sample time topt is dependent on each of the double layer capacitance CDL and the effective resistance RS of the cell 100. It will be appreciated that each of these values CDL, RS will vary over time. With this in mind, a variety of techniques are proposed to determine the optimum sample time topt.

In some embodiments, the optimum values COPT, ROPT of the double layer capacitance CDL and the effective resistance RS may be estimated such that the optimum sample time topt is calculated by the following equation.

$$topt = \frac{COPT * ROPT}{2}$$

There are various strategies of estimating these optimum values COPT, ROPT, and therefore the sample time topt.

In some embodiments, COPT and ROPT may be set as the arithmetic mean of maximum and minimum values of CDL and RS respectively. Additionally or alternatively, COPT and ROPT may be set as the geometric mean of maximum and minimum values of CDL and RS respectively.

In another example, COPT and ROPT may be described using a statistical distribution. For example, COPT and ROPT of the cell 100 may be pre-characterised so that an estimate of topt can be obtained that minimizes an error over all values of RS and CDL. A measure of a central tendency and/or spread of the statistical distribution may then be used to select the optimum sample time topt.

In another example, the optimum sample time topt may be selected by numerical optimisation. For example, the RMS error over a plurality of estimates of RS versus actual RS may be minimized. As such, the worst case error can be reduced in exchange for the best case error being increased.

In another example, the optimum sample time topt may be estimated using (optionally recurrent) neural network prediction. For example, a neural network may be trained with inputs relating to the optimum values COPT, ROPT of CDL and RS respectively for given values of measured current IM. Optionally, the neural network may be trained with other conditions/parameters, such as temperature at the cell 100 and/or age of the cell 100. The trained neural network may then be used to predict the sample time topt based on the measured current IM. Implementations of neural networks are known in the art and so will not be described in detail here.

In another example, a Bayesian approach may be used to select the sample time topt. For example, an estimate of the optimum sample time topt' may be obtained using the following maximum a posteriori (MAP) adaptation.

$$topt',n = \alpha \cdot topt,nom + (1-\alpha)topt,\text{measured}$$

Alpha may be derived from a pseudo-count. topt,nom is the prior estimate of optimal sample time topt and topt, measured is the current estimate of optimal sample time topt.

It will be appreciated that the optimum sample time topt may vary with changes in one or more conditions of the cell 100. Such conditions may comprise one or more of ageing of the cell 100, temperature at the cell 100, and pressure at the cell 100. The CA processor 302 may be configured to take one or more of these conditions (and/or other condition(s)) into account when determining the optimum sample time topt.

In some embodiments, the sample time topt may be determined dynamically. For example, the sampling time topt may be determined by considering at least a portion of the measured response IM to the stimulus VSTEP. For example, the time constant tau (CDL*RS) may be determined dynamically based on the measured response.

In the case where the non-Faradaic current INF has a much larger amplitude than the Faradaic current IF, the CA processor 302 may control the ADC 206 to sample the output voltage VO and estimate the time constant tau. For example, a section of the waveform in the time domain may be sampled to minimise the impact of the Faradaic current. Thus, averaging can be used to minimize the effect of short term effects on the measured current IM.

In another example, the CA processor 302 may be configured to control the ADC 206 to obtain a plurality of samples of the measured current IM. The CA processor 302 may then measure a time taken for an amplitude of the measured current IM to drop below a predetermined threshold. The predetermined threshold may be a percentage of a maximum amplitude of the measured response current IM. The time constant tau may then be determined for the cell 100 based on the time taken for the measured current IM to drop below that predetermined threshold. The optimum sample time topt may then be ascertained and the measured response at that sample time obtained. It will be appreciated that the measured response at that optimum sample time topt may have already been obtained during the process of estimating tau. It will also be appreciated that such a technique may require a wide-bandwidth front end (e.g. second amplifier 204) which may not be available, particularly in a portable (e.g. battery powered) device.

When the non-Faradaic current INF is not significantly larger than the Faradaic current IF in the measured response IM, the coefficient k referred to above may be determined. This is because the Faradaic current IF can no longer be assumed to be insignificant relative to the non-Faradaic current INF.

Factoring in the coefficient k, the measured response IM may be given by the following equation:

$$IM = \frac{k\sqrt{2}}{\sqrt{CDL*RS}} + \frac{VSTEP}{RS\sqrt{e}}$$

The coefficient k may be precomputed (for example during a calibration process). The solution to the above equation for RS is a quadratic equation. It will be appreciated that the computational complexity associated with solving such a quadratic equation to take into account the coefficient k may be substantial when compared to determining RS when the Faradaic current component IF (and therefore k) is not taken into account.

In one example, multiple samples of the measured current IM may be obtained from the ADC 206 over time. An optimum sampling time topt may be determined based on the plurality of obtained samples (e.g. an average determined optimum sampling time of multiple samples). One or more samples obtained around that optimal sampling time topt may then be used to determine the effective resistance RS of the cell 100.

Any of the approaches described above for determining the sample time topt for the cell 100 may be performed periodically, or in response to instruction. For example, when it is determined that the accuracy of estimates of effective resistance RS are falling, calibration may be performed to update the sample time topt.

Figure 9:
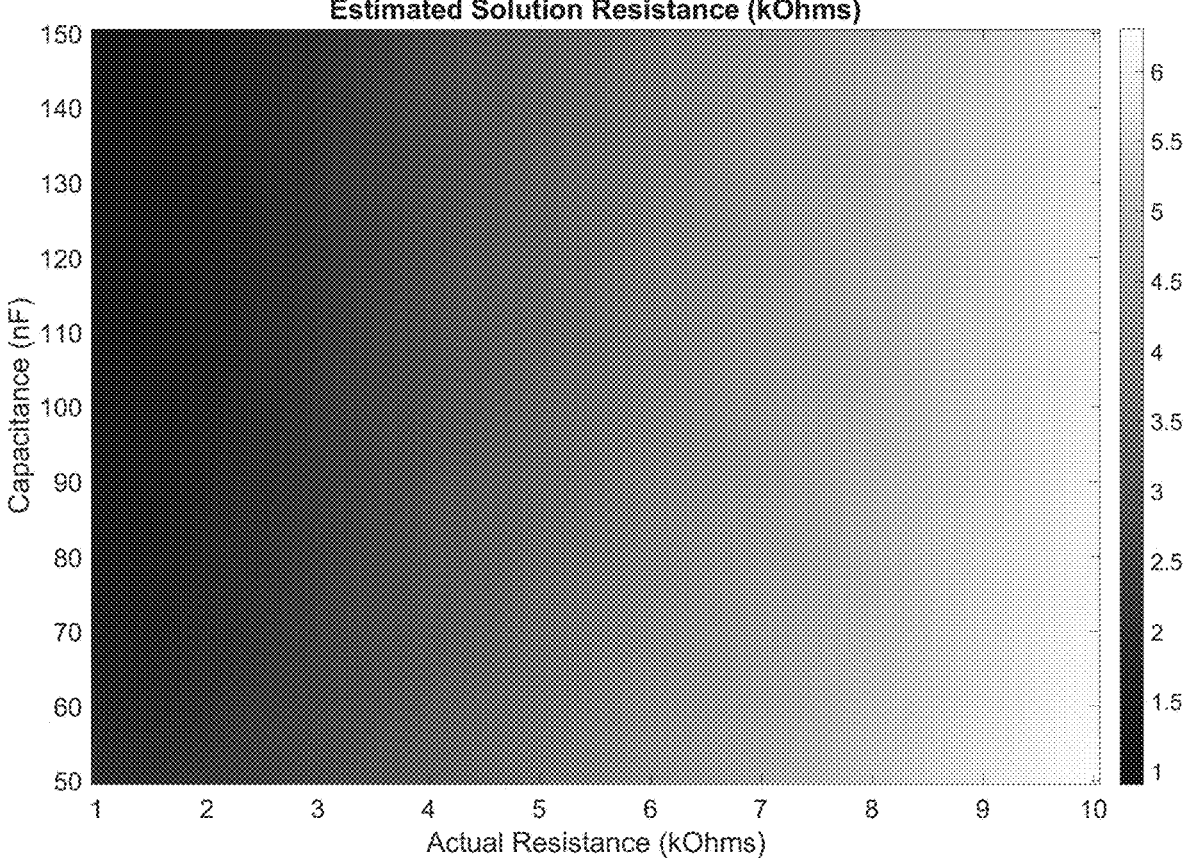
FIG. 9 is a plot showing how the relationship between measured and actual resistance of an electrochemical cell varies with double layer capacitance of the electrochemical cell.

It will be appreciated that estimates in optimum sample time topt may not be accurate for all conditions at the cell. Additionally, calculations of effective resistance RS from sampled measured current IM may thus have a residual error due to variations in measured current as a function of temperature, double layer capacitance CDL, and other cell parameters. Such residual error may be due to variability in the cell 100 and associated circuitry due to manufacturing variations and/or environmental conditions. As an example, FIG. 9 illustrates varied relationship between estimated and actual values of the effective resistance RS for different values of double layer capacitance CDL.

To compensate for residual error, a correction may be applied to calculated values of resistance RS of the cell 100 (or during derivation of the resistance RS from the measured current IM). Such compensation may be applied using a polynomial equation, a look up table and or a neural network. The correction function may utilise additional information from other sensors and/or measurement techniques. For example, information obtained using electrochemical impedance spectroscopy (EIS) may be used to determine impedance characteristics of the cell 100, such as double layer capacitance CDL. Additionally or alternatively, a temperature sensor may be provided in or proximate the cell 100 and a temperature at the cell 100 may be recorded. The measured double layer capacitance CDL and/or temperature may be input as a variable in the correction function to improve the estimate of the effective resistance RS of the cell. For example, the effective resistance RS may be estimated as a function of measured current IM, double layer capacitance CDL and temperature T, i.e.:

$$RS = g(IM, CDL, T)$$

The function g (or any other function) may be calibrated in advance to minimise error in the calculated effective resistance RS over all possible values of measured current IM.

It will be appreciated that measurements of response current may be corrupted by noise (that associated with Faradaic current IF as well as other noise sources). As such, it may be beneficial to repeat one or more measurements to reduce the impact of any noise. Such measurements may be performed until successive measured and sampled responses begin to converge.

In some embodiments, the measured response IM may be sampled at or near an estimated optimum sampling time. Further samples of the measured response IM may then be repeated. To accelerate convergence, an estimate of the effective resistance RS may be provided for an initial calculation of the measured current IM. For example, a low pass filter, such as an exponential moving average (EMA) filter may be used to estimate the effective resistance RS. The EMA filter may be in for following form.

$$RS',n = \alpha RS,n + (1-\alpha)RS,n-1$$

Where alpha is a weighted factor between 0 and 1 which sets the bandwidth of the EMA filter. The initial value of the filter may be set to an estimate of the effective resistance RS. In one example, the effective resistance RS may be estimated based on the geometric mean of the minimum and maximum expected values for the effective resistance RS, i.e.:

$$RS,\varphi = RS,opt = \sqrt{RS,\min \cdot RS,\max}$$

In other examples, the effective resistance RS may be initially estimated using other techniques (e.g., arithmetic mean, statistical distribution(s), neural network(s), etc.).

Measurements of effective resistance RS may be repeated until they converge to a predetermined level, for example until a delta between successive measurements is below a threshold θ:

$$\Delta = |RS',n - RS',n-1|$$

If the delta falls below the threshold, then the final measurement of RS' may be taken as an accurate measurement of the effective resistance RS of the cell 100.

In embodiments in which multiple samples of the measurement current IM are obtained over time, only some of the measured samples will be optimum in terms of SNR characteristics. As such, in some embodiments, the CA processor 302 may be configured to stop sampling, for example when the current sample time tsample is above a threshold duration after the optimum sample time topt. For example, if the sample time tsample exceeds the optimum sample time topt by more than a threshold θ' then sampling may stop, i.e.:

$$\text{if } tsample - topt > \theta' \text{ then stop}$$

Where θ' is the threshold relating to a duration in time after the optimum sampling time topt. In some embodiments such a duration may be set to 3 or 4 times the optimum sampling time topt.

In some embodiments, a number of samples may be taken around the optimum sampling time topt. Then, if the estimate of effective resistance RS has not converged (or not converged adequately), then the CA processor 302 may be configured to signal application of a further stimulus (e.g. a voltage step) to obtain further measurements of response current IM (and resistance RS).

In some embodiments, a Bayesian estimator may be used to estimate the effective resistance RS. For example, an estimate of the effective resistance RS' may be obtained using the following maximum a posteriori (MAP) adaptation.

$$RS'_{,n} = \alpha RS,nom + (1-\alpha)RS,measured$$

Alpha may be derived from a pseudo-count. RS,nom is the prior measurement of effective resistance RS and RS,measured is the current measurement of effective resistance RS of the cell 100.

It will be appreciated that the effective resistance RS of the cell 100 may be used to adjust operation of the circuit 300 or other circuitry associated with the cell 100. For example, based on the determined resistance RS, one or more of the following may be determined:

An optimum bias voltage to be applied to the electrochemical cell during sensing of an analyte;

A quality of an electrolyte in the electrochemical cell;

A fault at the electrochemical cell;

One or more offsets for subsequent processing;

Updates to an equivalent circuit model (ECM) for the electrochemical cell.

In embodiments described above the electrochemical cell 100 to be characterised comprises three electrode; a reference electrode RE, a working electrode WE and a counter electrode CE. Embodiments of the present disclosure are not limited to characterisation of such cells.

Figure 10:
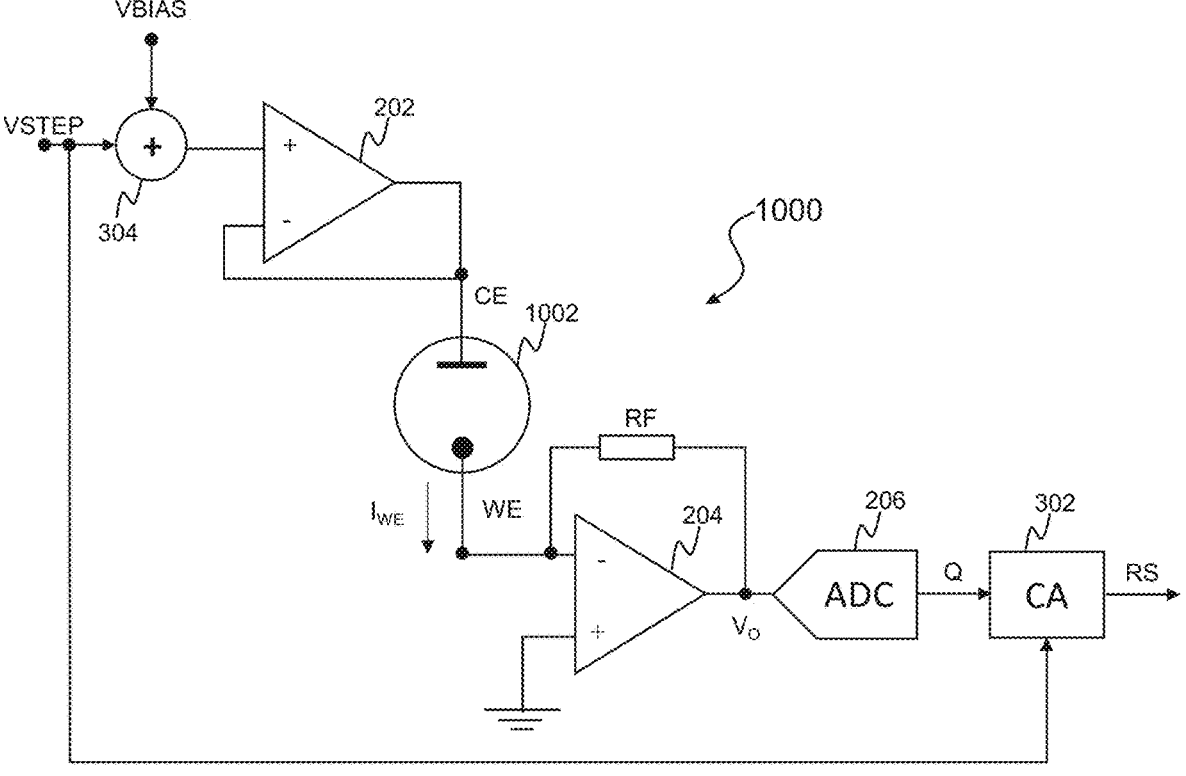
FIG. 10 is a schematic diagram of a drive and measurement circuit which is a variation of the circuit of FIG. 3.

FIG. 10 is a schematic diagram of a drive and measurement circuit 1000 which is a variation of the circuit 300 of FIG. 3. The circuit 1000 differs in that the three-electrode cell 100 has been replaced with a two-electrode cell 1002 comprising a working electrode WE and a counter electrode CE. In this arrangement, the inverting input of the first amplifier 202 is coupled to the counter electrode CE (instead of the reference electrode as is the case in FIG. 3).

By reducing the size and power of drive and measurement circuitry such as that described herein, multiple electrochemical sensors can be integrated into a single device, thereby either providing redundancy or enabling the sensing of multiple analytes in a single chip. This may be particularly advantageous in applications such as continuous glucose monitoring, where it may be desirable to measure concentrations of several analytes including but not limited to two or more of glucose, ketones, oxygen, lactate, and the like.

Figure 11:
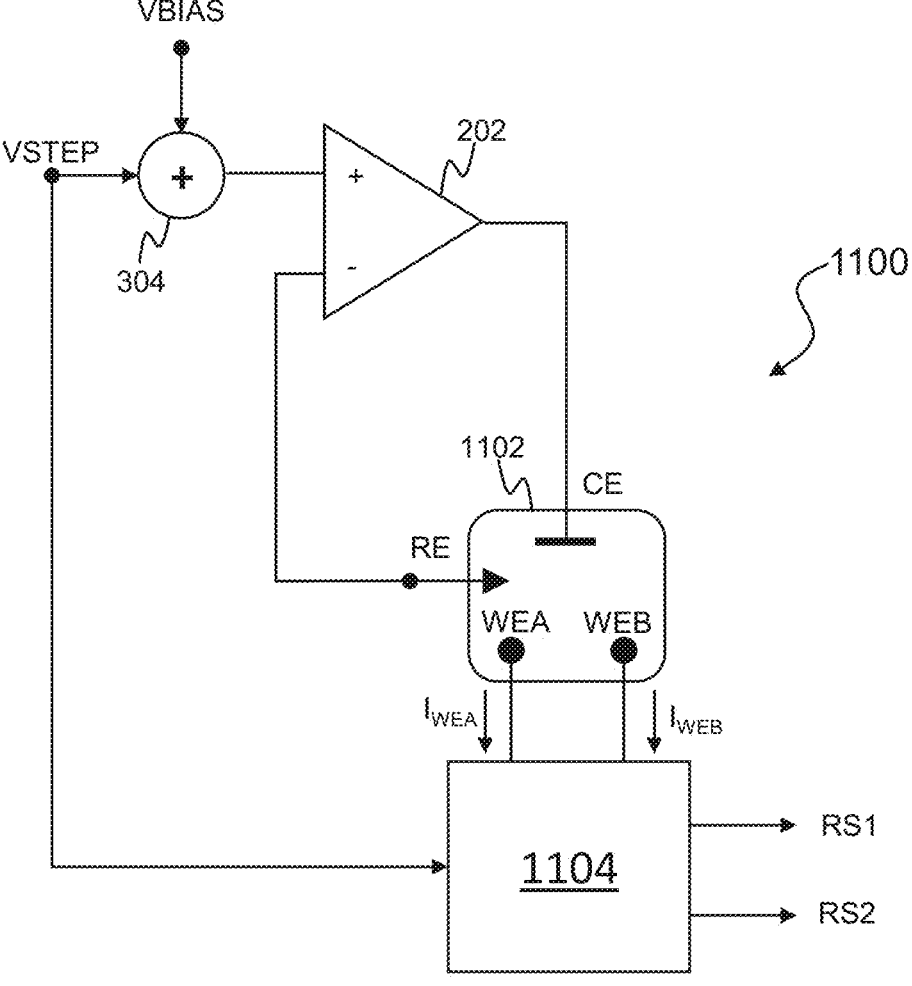
FIG. 11 illustrates an example drive and measurement circuit which is a variation of the circuit of FIG. 3.

FIG. 11 illustrates an example drive and measurement circuit 1100 which is a variation of the circuit 300 of FIG. 3. Like parts have been given like numbering. In the circuit 1100, an electrochemical cell 1102 is provided comprising first and second working electrode WEA, WEB, a counter electrode CE, and a reference electrode RE. A measurement circuit 1104 is provided which outputs first and second effective resistance values RS1, RS2. The measurement circuit 1104 may incorporate one or more elements of the circuit 300 shown in FIG. 3 for processing a response to a stimulus applied to the cell 1102 by the first amplifier 202 (such as the second amplifier 204, CA processor 302 etc.). The measurement circuit 1104 may, for example, comprise two processing channels, each processing channel implementing measurement circuitry shown in FIG. 3. Alternatively, the measurement circuit may be implemented using a single processing stream multiplexed by a multiplexer (not shown).

The measurement circuit 1104 may be configured to determine the first resistance value RS1 in accordance with the techniques discussed above with respect to the CA processor 302 based on a current $I_{WEA}$ derived from the first working electrode WEA, the step voltage stimulus VSTEP and optionally one or more additional conditions at the cell 1102. The measurement circuit 1104 may be further configured to determine the second resistance value RS2 in accordance with the techniques discussed above with respect to the CA processor 302 based on a current $I_{WEB}$ derived from the second working electrode WEB, the step voltage stimulus VSTEP and optionally one or more additional conditions at the cell 1102. Calculating the two resistance values RS1, RS2 for the cell 1102. For example, redundancy is provided in case of a fault or adverse condition at one of the working electrodes WEA, WEB. Additionally, a fault at one of the working electrodes WEA, WEB can be more easily ascertained, for example by comparing the two calculated resistance values RS1, RS2. The time taken to characterise the cell 1102 resistance may also be reduced by performing parallel resistance measurements at the first and second working electrodes WEA, WEB.

In the embodiments described herein, the electrochemical cell 100 has been described in the form of an electrochemical sensor comprising counter and working electrodes CE, WE (and optionally a reference electrode RE). For such sensors, the stimulus is typically a voltage, and the measured response is a current. It will be appreciated that embodiments of the present disclosure are not limited to such cells and extend to other types of cells, such as electrochemical cells acting as a power source (i.e. a battery) and potentiometric sensors (such as an ion selective electrolyte (ISE) sensor (e.g. a pH meter)). For batteries, potentiometric sensors and the like, the driving stimulus of the cell is typically a current, and the measured response is a voltage. Embodiments described above in relation to the amperometric electrochemical cell 100 can equally be applied to cells which are driven with a current, instead of a voltage and for which voltage is the response being measured.

The various circuitry and electrochemical cells described herein may be incorporated into a continuous analyte sensor or a continuous glucose sensor or a continuous glucose monitor. The terms "continuous analyte sensor", "continuous glucose sensor", and "continuous glucose monitor" as used herein, will be well-known to a person of ordinary skill in the art and are not to be limited to a special or customized meaning. These terms refer, without limitation, to a device that continuously measures a concentration of an analyte/glucose and/or calibrates the sensor or an electrochemical cell incorporated therein (e.g., by continuously adjusting or determining the sensor's sensitivity and background).

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general-purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for determining a resistance of an electrochemical cell comprising at least one first electrode and a second electrode, the circuitry comprising:
   drive circuitry configured to apply a stimulus to the at least one first electrode of the electrochemical cell;
   sense circuitry configured to measure a response of the electrochemical cell to the stimulus, the response comprising a faradaic component and a non-faradaic component; and
   processing circuitry configured to:
      sample the response at a sample time, the sample time selected to maximise a ratio of the non-faradaic component to the faradaic component; and
      determine the resistance of the electrochemical cell based on the response at the sample time.

2. Circuitry of claim 1, wherein the stimulus comprises a step signal or an impulse signal.

3. Circuitry of claim 1, wherein the resistance is a series resistance of the electrochemical cell.

4. Circuitry of claim 1, wherein the sample time coincides with a time at which a rate of change of the ratio is within a threshold range of zero.

5. Circuitry of claim 1, wherein the sample time (topt) is determined based on an equation defined by:

$$t_{opt} = \frac{C_{OPT} R_{OPT}}{2}$$

where $C_{OPT}$ is an estimated capacitance value of a double-layer capacitance $C_{DL}$ of the electrochemical cell and $R_{OPT}$ is an estimated resistance value of the resistance.

6. Circuitry of claim 5, wherein the estimated resistance value $R_{OPT}$ is determined as an arithmetic mean or a geometric mean of a maximum value and a minimum value of the resistance, and wherein the estimated capacitance value $C_{OPT}$ is determined as an arithmetic mean or geometric mean of a maximum value and a minimum value of double-layer capacitance $C_{DL}$.

7. Circuitry of claim 1, wherein the sample time is selected based on a statistical distribution of the resistance of the electrochemical cell and a double-layer capacitance of the electrochemical cell, or wherein the sample time is determined by numerical optimization of the equation, or wherein the sample time is selected using a trained neural network.

8. Circuitry of claim 1, wherein the processing circuitry is configured to:

detect when an amplitude of the measured response drops below an amplitude threshold, wherein the sample time coincides with a time at which the amplitude of the measured response drops below an amplitude threshold.

9. Circuitry of claim 1, wherein the circuitry is configured to repeat, over one or more repetitions, the steps of applying the stimulus, measuring the response, and sampling the response at the sample time, wherein the processing circuitry is configured to:

adjust the sampling time in one or more of the one or more repetitions.

10. Circuitry of claim 9, wherein the processing circuitry is configured to adjust the sampling time based on a change in condition at the electrochemical cell, wherein the change in condition comprises one or more of:

a) ageing of the electrochemical cell;

b) a change in temperature at the electrochemical cell; and c) a change in pressure at the electrochemical cell.

11. Circuitry of claim 1, wherein the processing circuitry is configured to determine, based on the determined resistance, one or more of the following:

a) an optimum bias voltage to be applied to the electrochemical cell during sensing of an analyte;

b) a quality of an electrolyte in the electrochemical cell;

c) a fault at the electrochemical cell;

d) determine one or more offsets for subsequent processing; and e) updating an equivalent circuit model (ECM) for the electrochemical cell.

12. Circuitry of claim 1, wherein the electrochemical cell is an electrochemical sensor, wherein the stimulus is a stimulus voltage, wherein the measured response is a response current, wherein the resistance $R_S$, is calculated based on the following resistance equation:

$$R_s = \frac{V_{STEP}}{I_M \sqrt{e}}$$

where $V_{STIM}$ is the stimulus voltage and $I_M$ is the response current.

13. Circuitry of claim 1, further comprising a memory configured to store predetermined resistance values for the resistance at a plurality of values of the measured response.

14. Circuitry of claim 13, wherein the memory is configured to store predetermined resistance values for the resistance of the cell in response to stimuli having different amplitudes, wherein the processing circuitry is configured to:

control the drive circuitry to apply the stimulus at one of the different amplitudes; and determine the resistance based on a predetermined resistance value stored in the memory which corresponds with the one of the different amplitudes.

15. Circuitry of claim 13, wherein the memory is configured to store predetermined resistance values for the resistance of the cell at a plurality of different temperatures, wherein the processing circuitry is configured to:

determine the resistance based on a measured temperature of the electrochemical cell and the predetermined resistance value stored in the memory which corresponds with the measured temperature.

16. Circuitry of claim 13, wherein the memory is configured to store predetermined resistance values for the resistance of the cell at a plurality of different values of double layer capacitance of the cell, wherein the processing circuitry is configured to:

determine the resistance based on a measured double layer capacitance of the electrochemical cell and the predetermined resistance value stored in the memory which corresponds with the measured temperature.

17. Circuitry of claim 1, wherein the processing circuitry comprises an analog-to-digital converter (ADC) configured to sample the response, wherein the processing circuitry is configured to enable the ADC at the sample time.

18. Circuitry of claim 1, wherein the electrochemical cell comprises a potentiostat, or a potentiometric sensor, or a battery.

19. An electronic device, comprising the circuitry of claim 1.

20. The electronic device of claim 19, wherein the device comprises one of a mobile computing device, a laptop computer, a tablet computer, a games console, a remote control device, a home automation controller or a domestic appliance, a toy, a robot, an audio player, a video player, or a mobile telephone, and a smartphone.

21. A system comprising:

an electrochemical cell; and circuitry for determining a resistance of the electrochemical cell comprising at least one first electrode and a second electrode, the circuitry comprising:

drive circuitry configured to apply a stimulus to the at least one first electrode of the electrochemical cell;

sense circuitry configured to measure a response of the electrochemical cell to the stimulus, the response comprising a faradaic component and a non-faradaic component; and processing circuitry configured to:

sample the response at a sample time, the sample time selected to maximise a ratio of the non-faradaic component to the faradaic component; and determine the resistance of the electrochemical cell based on the response at the sample time.

22. A method of determining a resistance of an electrochemical cell comprising at least one first electrode and a second electrode, the method comprising:

apply a stimulus to the at least one first electrode of the electrochemical cell;

measure a response of the electrochemical cell to the stimulus, the response comprising a faradaic component and a non-faradaic component;

sample the response at a sample time, the sample time selected to maximise a ratio of the non-faradaic component to the faradaic component; and determine the resistance of the electrochemical cell based on the response at the sample time.

* * * * *